(12) United States Patent
Gabara

(10) Patent No.: US 6,307,443 B1
(45) Date of Patent: Oct. 23, 2001

(54) BANDPASS FILTERS WITH AUTOMATIC TUNING ADJUSTMENT

(75) Inventor: Thaddeus J. Gabara, Murray Hill, NJ (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/405,247

(22) Filed: Sep. 24, 1999

(51) Int. Cl.[7] .................................................. H03H 7/12
(52) U.S. Cl. ................................. 333/17.1; 333/174
(58) Field of Search ................................. 333/17.1, 17.3, 333/174

(56) References Cited

U.S. PATENT DOCUMENTS

| | | | |
|---|---|---|---|
| 3,715,690 | * | 2/1973 | Young et al. ........................ 333/17.1 |
| 4,257,018 | * | 3/1981 | Masdea et al. ..................... 333/17.1 |
| 4,726,071 | * | 2/1988 | Jachowski ....................... 333/17.1 X |
| 5,227,743 | * | 7/1993 | Yamamoto ........................ 333/17.1 |
| 5,396,195 | | 3/1995 | Gabara .............................. 331/113 R |
| 5,808,527 | * | 9/1998 | De Los Santos .................... 333/205 |
| 6,150,901 | * | 11/2000 | Auken ................................. 333/174 |

OTHER PUBLICATIONS

Khorramabadi et al., 1996 IEEE International Solid–State Circuits Conference, Session 10, Paper FA 10.6, pp. 172–173.

* cited by examiner

*Primary Examiner*—Benny Lee
*Assistant Examiner*—Stephen E. Jones
(74) *Attorney, Agent, or Firm*—Darby & Darby

(57) ABSTRACT

A method and system for tuning a tunable bandpass filter includes a bandpass filter having a passband which is dependant on the value of a tuning signal. A data signal having a dominant frequency component is applied to the filter and the power of the signal passed by the filter is determined. The tuning signal is adjusted until the passed power is maximized, indicating that the filter is tuned to the dominant frequency. The tuning signal can then be applied to other tunable circuits, including an oscillator having an output used as a clock signal to extract data from the data signal applied to the filter.

8 Claims, 4 Drawing Sheets

BANDPASS FILTERS WITH AUTOMATIC TUNING ADJUSTMENT

FIELD OF THE INVENTION

This invention relates to a system and method for implementing a self tuning filter.

BACKGROUND OF THE INVENTION

Analog circuits, such as filters and oscillators, are increasingly being fabricated as part of integrated circuits ("ICs"). On any particular IC, the frequency response of a circuit is dependent on the values of the capacitors, resistors, transistors, and other circuit components which are used to form the circuit element. Although circuit layouts can be designed very precisely, in practice, the actual size of circuit components across different ICs tends to be highly variable due to cumulative tolerance errors which occur during the manufacturing process. For example, the actual value of a capacitor on an IC can vary by up to ±50% from the nominal design value. Further, the performance is also dependent on the absolute temperature at which the circuit is operating. Thus, it is common practice to provide integrated circuits with various performance characteristics that can be adjusted to compensate for manufacturing variances and operating temperature.

In a conventional arrangement, the performance of bandpass filter circuits and other circuits, such as inductor-capacitance ("LC") based circuits, are tuned or otherwise manually adjusted using a digital signal processor ("DSP") which operates by measuring the performance of a representative circuit as it acts on an externally supplied reference signal. For example, in one particular implementation, a multi-stage filter is tuned by first disconnecting one of the filters from the other stages and connecting its input to a DC reference voltage with a predefined and known magnitude. The magnitude of the DC output voltage is then digitized and stored within the DSP. Next, a reference sinusoidal signal is applied to the filter input. The sinusoidal frequency is chosen to be at or close to the desired filter −3 dB frequency and has a peak amplitude which is equal to the magnitude of the reference DC voltage. The power of the filter output is determined and the DSP compares the two measurements and generates a tuning control signal in accordance with predefined data concerning the behavior of the filter at varying tuning signal inputs. (see, Khorramabadi, "Baseband Filters for IS-95 CDMA Receiver Application Featuring Digital Automatic Frequency Tuning", IEEE International Solid-State Circuits Conference, 1996, page 172–173).

Although such tuning techniques are effective, they depend on the presence of specific reference signals which must be generated off-chip to avoid being compromised by manufacturing variations. Thus, additional circuitry external to the IC is required. In addition, such an arrangement uses valuable chip I/O, which may increase both the cost and complexity of the chip packaging and design.

Accordingly, it would be advantageous to provide a tuning circuit which can automatically tune a component, such as a bandpass filter, without requiring an external reference signal. It would also be advantageous if such a circuit can automatically generate a clock signal for use throughout the chip, which clock signal has a frequency tied to the resident frequency of the tuned circuit.

SUMMARY OF THE INVENTION

A method and system for tuning bandpass filters and other tunable circuit elements includes a tunable filter which receives an input signal having a particular primary frequency component, such as a carrier wave frequency. The input signal can be the same signal as is processed by the circuit during normal operation. The power of the filtered signal is measured and the filter tuning is adjusted until the magnitude of the filtered signal power is at a maximum. In one embodiment, the output signal of a tunable bandpass filter is fed to a series diode-capacitor network. The DC voltage on the capacitor is monitored as the values of one or more tuning elements, such as a tunable capacitor array, are adjusted. For a bandpass filter, the DC voltage on the monitored capacitor indicates the average peak magnitude of the filtered signal. This value will have a maximum peak when the bandpass filter is tuned so that the passband is centered around the input carrier frequency. Once the maximum DC voltage is found, the value of the tuning element is maintained at this value during normal operation of the filter. Advantageously, tuning is accomplished without the need to use an external reference frequency. Rather, the frequency content of the input signal itself is used to tune the filter around the proper frequency. In addition, because components on the same IC will be subject to the same manufacturing and operating conditions, this value can then also be used to tune other circuit components on the IC.

In a particular implementation, and according to a further aspect of the invention, a bandpass filter which is used to receive an input data stream is tuned to a primary frequency component of the input data stream. After the filter is tuned, the derived tuning signal is used to adjust the resonant frequency of an oscillating circuit, such as a tunable LC tank circuit. The oscillator output will then mirror the primary frequency. This output signal can be increased or decreased in frequency as required, i.e., by applying it to a frequency doubling circuit, in order to generate a clock signal suitable for extracting data from the filtered input signal.

BRIEF DESCRIPTION OF THE DRAWINGS

The foregoing and other features of the present invention will be more readily apparent from the following detail description in drawings of illustrated embodiments of the invention in which.

DETAILED DESCRIPTION OF THE PREFERRED EMBODIMENT

Figure 1:
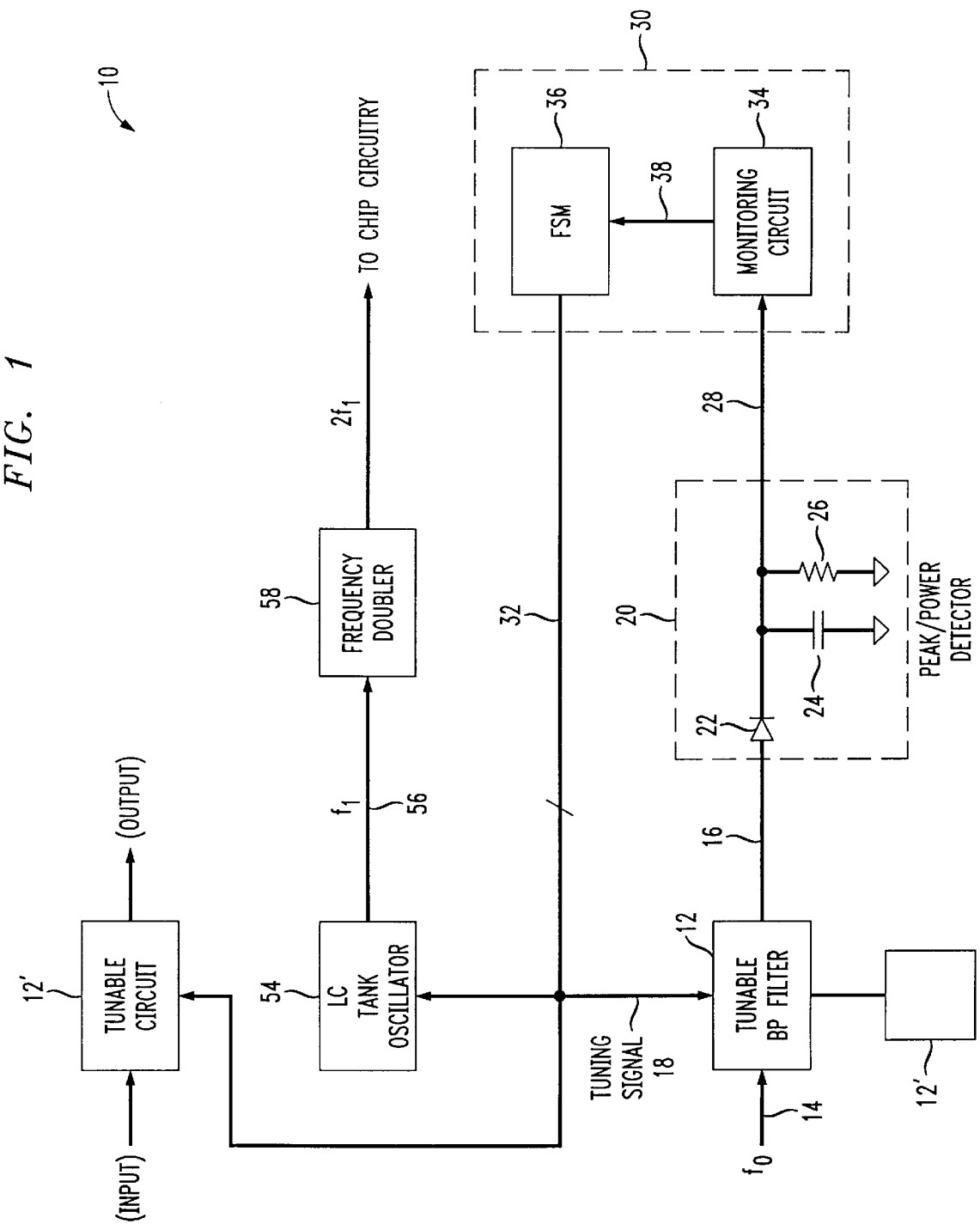
FIG. 1 and FIG. 1A are block diagrams of a system for tuning a bandpass filter.
Figure 1A:
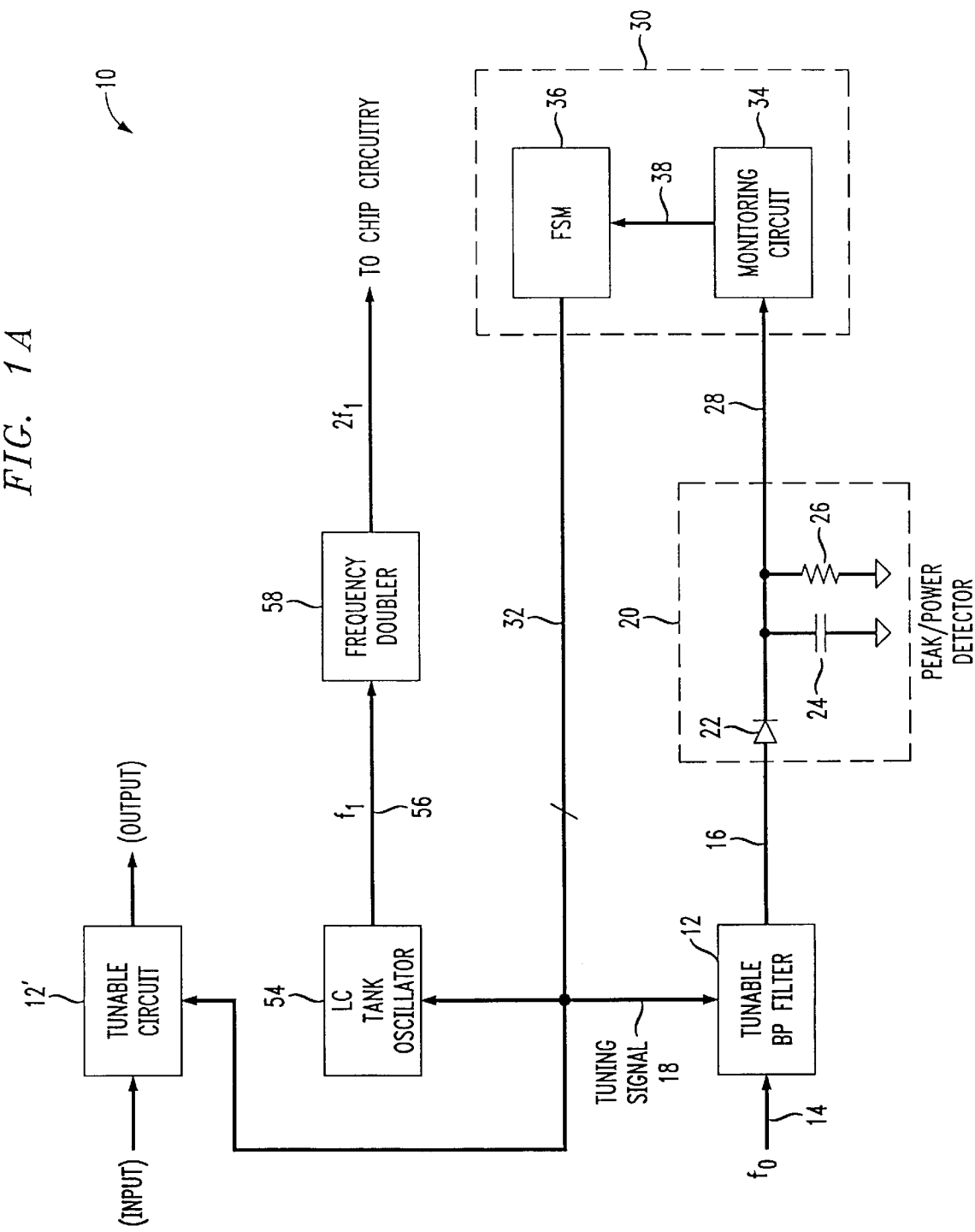

FIG. 1 and FIG. 1A are block diagrams of a system 10 for automatically tuning a filter 12 which includes at least one electronically tunable circuit element. Preferably filter 12 is a tunable bandpass filter. However, other filter types, such as band stop filters, may also be used. The precise form of the filter 12 may be varied according to the needs of the particular application. Preferably, the tuning element comprises a tunable capacitance, such as a digitally tunable capacitor array. Tunable capacitor arrays and tunable filters utilizing such arrays are well known and various tunable circuit designs suitable for use in according to the present invention will be known to those of skill in the art and are therefore not specifically discussed herein.

Filter 12 has input 14 to which receives the signal to be filtered, an output 16, and a tuning signal input 18 which receives one or more signal components used to tune the filter 12. The output 16 of the filter 12 is applied to a peak or power detector circuit 20, which preferably comprises a diode 22 driving an RC circuit including capacitor 24 and resistor 26 configured as illustrated. The magnitude of the capacitor 24 and resistor 26 are chosen to define an RC time constant which is appropriate for the expected frequency of the signal applied to input 14.

The output 28 of the detector circuit 20 is applied to a tuning control circuit 30 which is used to generate a tuning signal 32 that maximizes the magnitude of the output 28 of detector circuit 20. The operation of tuning circuit 30 is dependent to some extent on the manner in which the filter 12 is tunable. Preferably, tuning circuit 30 comprises a monitoring circuit 34 which compares the magnitude of a current input from detector circuit 20 with the magnitude of a previous input and produces an output signal 38 which indicates the results of the comparison. A finite state machine 36 then acts on the comparison results to adjust the tuning signal so as to achieve a maximum power.

In one embodiment, the monitoring circuit 34 includes an analog-to-digital converter coupled to an appropriate digital memory (not shown) and is configured to compare the present power magnitude with a prior magnitude and determine if a maximum value has been reached. If not, an indication is sent to the finite state machine 36 via signal 38 that the to value of the tuning signal 32 should be changed. Alternatively, the monitoring circuit can simply provide an indication as to whether the present power level is greater than or less than a previous value and the determination as to whether the tuning signal value should be changed left to the finite state machine 36. The particular structure of the finite state machine 36 is dependent on the specific tuning algorithm used and appropriate designs will be apparent to those of skill in the art. Particular tuning algorithms are discussed in more detail below.

Figure 2:
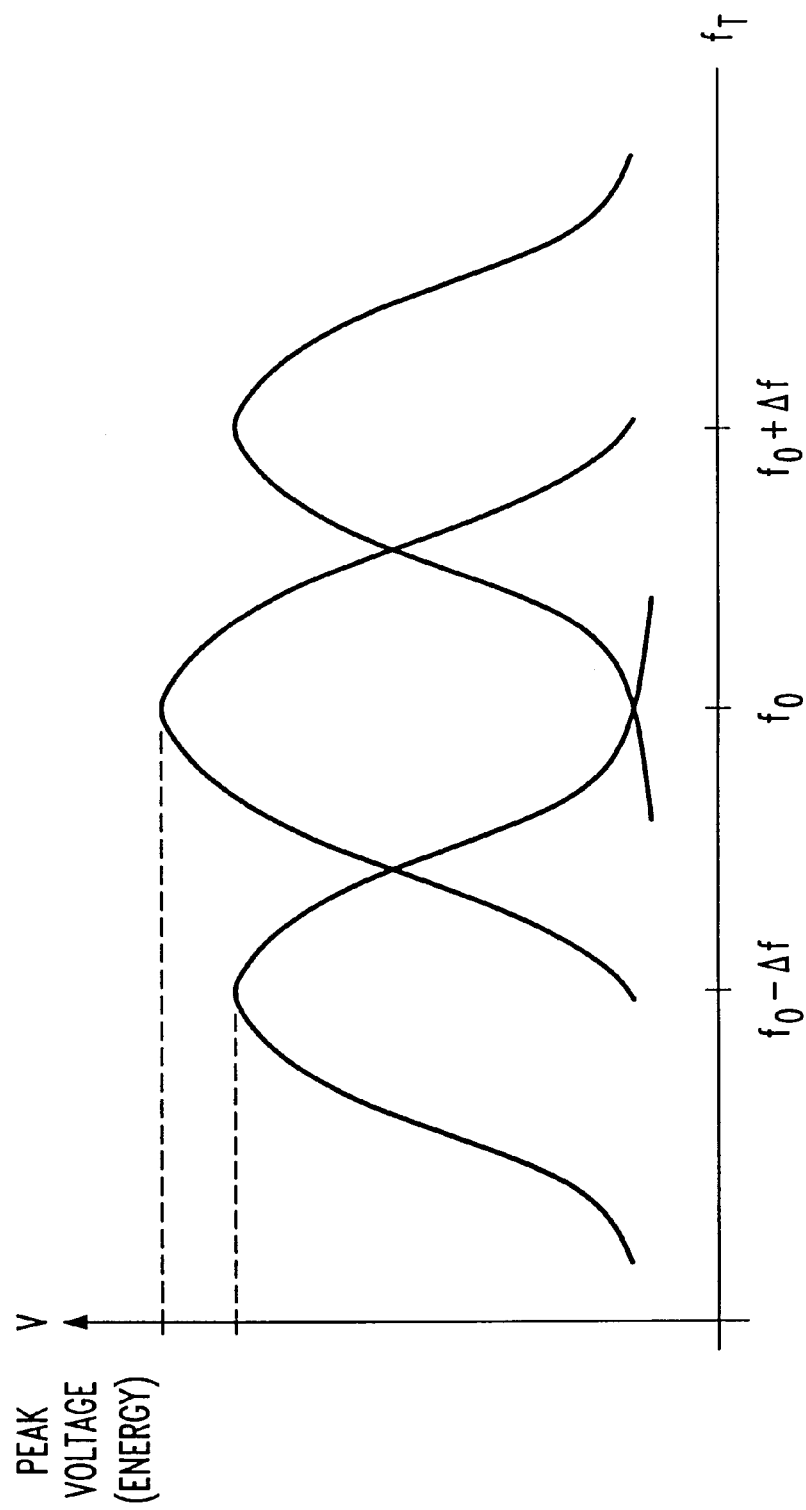
FIG. 2 is a graph showing the output of a tunable bandpass filter tuned to various center frequencies.

As the value of the tuning signal 28 is adjusted, the center frequency of the filter 12 varies accordingly. FIG. 2 is an illustration of the output characteristics of a bandpass filter at different center frequency tunings. As illustrated, for an input signal having a primary frequency component of $f_0$, a maximum average peak value or signal energy occurs when the passband is centered around the frequency $f_0$. As the filter is tuned to center frequencies greater or less than $f_0$, less of the $f_0$ signal is passed by the filter, resulting in a peak voltage of lower magnitude.

By adjusting the filter to a point where the output power is at a peak, the filter is automatically tuned to a frequency centered around the carrier frequency $f_0$ or other dominant frequency in the signal without the use of a reference signal or precise knowledge of the value of the actual frequency $f_0$. Preferably, to assure the best tuning range and most appropriate frequency response, the filter 12 should be designed with a nominal frequency response centered around $f_0$ and the tunable elements in the circuit 12 used to adjust for those variations in the actual frequency response which are due to manufacturing tolerance errors, changes in operating temperature, etc. Once the tunable filter 12 has been properly tuned in accordance with a dominant frequency $f_0$ of the input signal, the value of the tuning signal is used to adjust the operating frequency of additional tunable circuits 12' (as shown in FIG. 1A) which are "tunably compatible" with the filter 12, e.g., which can be tuned by application of the (properly adjusted) tuning signal or a secondary signal derived from the tuning signal. Generally, tunably compatible circuits of this type are fabricated on the same integrated circuit and contain tunable elements which are analogous to the tunable elements in the filter circuit 12.

Various techniques can be used to tune the filter 12 in order to produce an output signal having a maximum average peak voltage. According to one technique suitable for use in a digitally tuned filter, such as one which incorporates a digitally tunable capacitor array, the value of a digital tuning signal 32 is incremented on a periodic basis in order to "slide" the passband of the filter upwards or downwards by adjusting the tunable capacitance between its minimum and maximum value in incremental steps. After each step, the power or maximum average peak of the filter output 16 as provided by detector circuit 20 is determined and compared with a prior value. If, after the first adjustment, the power level has decreased, the direction of the slide is reversed. Adjustment then continues until a decrease in the average peak is again detected. This indicates that the tuning circuit has advanced beyond the maximum value, and thus that the prior tuning value can be used. Alternative tuning schemes can also be used as will be apparent to those of skilled in the art.

Figure 3:
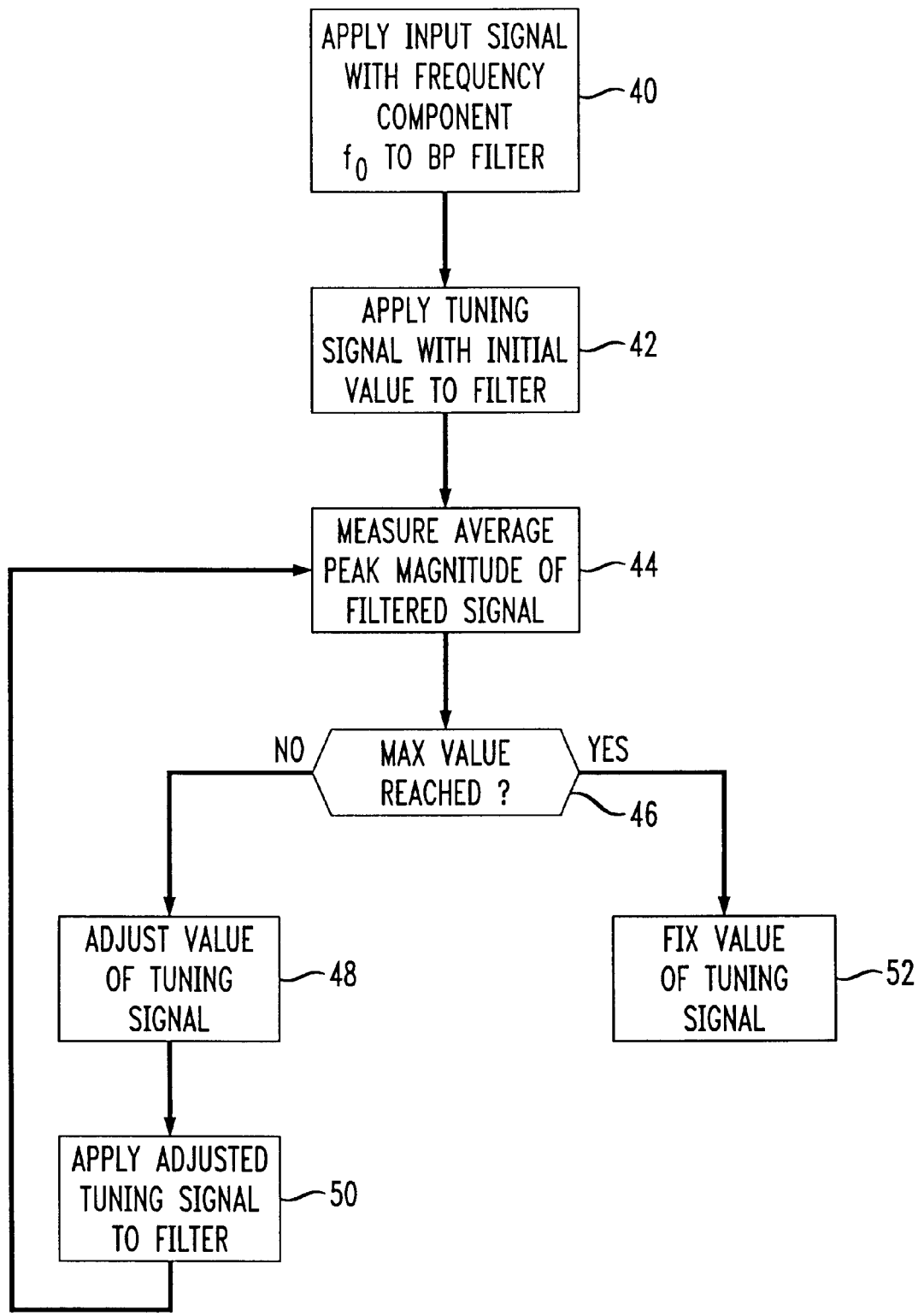
FIG. 3 is a flowchart illustrating one method of tuning a bandpass filter according to the present invention.

FIG. 3 is a flowchart which summarizes the general method of tuning according to the invention. Initially, an input signal having a major frequency component at frequency $f_0$ is applied to the input of the tunable filter. (Step 40). A tuning signal having an initial tuning value is then applied to the filter (Step 42) and the average peak magnitude or power of the filtered signal is measured (Step 44). If the measured magnitude is not the maximum value (Step 46) then the value of the tuning signal is adjusted according to the particular tuning algorithm which is used (Step 48) and the adjusted tuning signal is applied to the filter (Step 50). The average peak magnitude of the filtered signal is then determined (Step 44) and the process repeats. It is possible that the initial tuning value will be the one to produce a maximum and this should be considered when implementing the particular method of adjusting the value of the tuning signal. Once the maximum peak output signal is detected, the value of the tuning signal is fixed (Step 52) and can be applied to both the tuned filter and to other circuit components which are tunably compatible with the tuned filter.

According to another aspect of the invention, and with reference to FIG. 1, the frequency $f_0$ can be "extracted" from the turning signal and used to generate a clock signal for use by other circuit elements. In one particular embodiment, the tuning signal is applied to a tunable oscillator circuit 54, such as an LC tank oscillator circuit, which is tunably compatible with the filter circuit 12 and which produces and output signal 56 having a frequency $f_1$. For example, the oscillator circuit 54 may have a frequency of oscillation that is dependent on the net capacitance of a tunable capacitor array that is analogous to, and preferably a duplicate of, one present in the tunable bandpass filter. Most preferably, the oscillator circuit is designed to operate at a frequency near the expected value of $f_0$ and, when the appropriate tuning signal is applied, the frequency $f_1$ of the output signal 56 will substantially equal $f_0$. This signal can then be used throughout the chip, either as-is, or modified as needed. For example, the output signal 56 of the oscillator 54 can be applied to a frequency doubling circuit 58 to produce a clock signal having a frequency of $2f_1$, which is twice the frequency $f_0$ when the filter circuit is tuned. Although the frequency doubling circuit 58 is shown as separate from the oscillator 54, the doubling circuit 58 can be considered part of the oscillator itself.

If the input signal applied to the filter 12 contains a digital data input stream the generated clock signal 56, etc. can be used to extract the data. For example, a 1.25 gigabit per second input data stream has a frequency component of 625

MHZ. The filter 12 is designed to operate at a nominal frequency of 625 MHZ. Once the filter 12 has been tuned, e.g., according to the method described above, the tuning signal is applied to the oscillator circuit 54 which produces an output signal having a frequency of 625 MHZ. This frequency is then doubled to produce a clock signal having a frequency 1.25 GHz, suitable for controlling circuitry designed to extract the data from the digital input stream. Because the internal clock signal is generated solely according to the frequency components in the input signal, the circuit will adapt to drift and other variations in the input signal frequency, making for a more robust circuit.

While the invention has been particularly shown and described with reference to the preferred embodiments discussed above, it will understood by those skilled in the art that various changes in form and details may be made without departing from the spirit and scope of the invention.

I claim:

1. A method for tuning a tunable bandpass filter having a passband dependent on the value of a tuning signal, the method comprising the steps of:

(a) applying a data signal having a dominant frequency component to a filter input;

(b) applying a tuning signal having a defined value to the filter;

(c) incrementing a value of the tuning signal on a periodic basis by adjusting a tunable capacitance;

(d) determining a power value of a filtered output signal from the filter;

(e) ascertaining when the determined power value is at a maximum;

(f) in the event that the determined power value is not a maximum, adjusting the value of the tuning signal and applying the adjusted value tuning signal to the filter; and (g) repeating steps (c)–(f) until the determined power value is a maximum.

2. The method of claim 1, wherein the step of determining a power value comprises the step of measuring an average peak magnitude of the filtered output signal.

3. The method of claim 1, further comprising the step of applying the tuning signal to at least one tunably compatible circuit.

4. The method of claim 1, further comprising the steps of:

applying the tuning signal to a tunable oscillator which is tunably compatible with the filter; and deriving a clock signal from an output of the oscillator.

5. The method of claim 4, further comprising the step of using the clock signal as a reference to extract data from the data signal.

6. A circuit including a bandpass filter with automatic tuning adjustment comprising:

a tunable bandpass filter having an input and an output and being responsive to a tuning signal having a value;

a power detecting circuit receiving the output of the filter and generating a power signal having a magnitude related to an average power of the received filter output;

a digitally tunable capacitor array incrementing a value of the tuning signal on a periodic basis by adjusting a tunable capacitance;

a tuning control circuit responsive to the power signal and generating the tuning signal, the tuning circuit configured to vary the value of the tuning signal to maximize the magnitude of the power signal.

7. The circuit of claim 6, wherein the tuning control circuit comprises:

a monitoring circuit receiving the power signal and producing an output signal dependent on a comparison of the power signal and a previous magnitude of the power signal.

8. The circuit of claim 6, further comprising a tunable oscillator which is tunably compatible with the filter, the oscillator receiving the tuning signal and producing an oscillating output signal having a frequency dependent on the value of the tuning signal.

* * * * *